United States Patent [19]
Ludikhuize

[11] Patent Number: 5,976,942
[45] Date of Patent: Nov. 2, 1999

[54] METHOD OF MANUFACTURING A HIGH-VOLTAGE SEMICONDUCTOR DEVICE

[75] Inventor: Adrianus W. Ludikhuize, Eindhoven, Netherlands

[73] Assignee: U.S. Philips Corporation, New York, N.Y.

[21] Appl. No.: 08/770,030

[22] Filed: Dec. 19, 1996

[30] Foreign Application Priority Data

Dec. 21, 1995 [EP] European Pat. Off. .............. 95203584

[51] Int. Cl.$^6$ ................................................. H01L 21/331
[52] U.S. Cl. ...................... 438/358; 438/294; 438/328; 438/423; 438/542; 438/919
[58] Field of Search ..................... 438/328, 356, 438/357, 358, 275, 294, 414, 416, 423, 492, 220, 226, 293, 365, 368, 375, 919, 546, 547, 548

[56] References Cited

U.S. PATENT DOCUMENTS

| | | | |
|---|---|---|---|
| 3,635,773 | 1/1972 | Thire | 148/191 |
| 4,535,529 | 8/1985 | Jochems | 438/217 |
| 4,724,221 | 2/1988 | Jochems | 438/357 |
| 5,070,382 | 12/1991 | Cambou | 257/502 |
| 5,529,939 | 6/1996 | Lapham et al. | 438/322 |
| 5,759,902 | 6/1998 | Lapham et al. | 438/322 |

FOREIGN PATENT DOCUMENTS 0649177  4/1995  European Pat. Off. .

OTHER PUBLICATIONS

"A Versatile 700–1200–V IC Process For Analog and Switching Applications", by A.W. Ludikhuize, IEEE Trans. on Electron Devices, vol. 38, No. 7, Jul. 1991, pp. 1582–1589.

"High Voltage Thin Layer Devices (Resurf Devices)", by J.A. Appels et al, (Techn. Digests IEDM 1979, pp. 238/241.

*Primary Examiner*—Carl Whitehead, Jr.
*Assistant Examiner*—Khanh Duong
*Attorney, Agent, or Firm*—F. Brice Faller

[57] ABSTRACT

An epitaxial layer with a doping of approximately $10^{12}$ atoms per cm$^2$ is used in accordance with the resurf condition for the high-voltage circuit element in high-voltage integrated circuits of the resurf type. If the circuit comprises a zone which is provided in the epitaxial layer, which is of the same conductivity type as the substrate, and to which a high voltage is applied, the doping between this zone and the substrate must in addition be sufficiently high for preventing punch-through between the zone and the substrate. A known method of complying with these two requirements is to make the epitaxial layer very thick. It is found in practice, however, that this method is often not very well reproducible. According to the invention, the epitaxial layer is provided in the form of a high-ohmic layer which is doped from the upper side (3a) and from a buried layer (3b). The buried layer is blanket-deposited, which dispenses with a masking step, and is locally redoped by the island insulation zone (4).

7 Claims, 2 Drawing Sheets

METHOD OF MANUFACTURING A HIGH-VOLTAGE SEMICONDUCTOR DEVICE

BACKGROUND OF THE INVENTION

The invention relates to a method of manufacturing a high-voltage semiconductor device of the resurf type whereby a silicon body with a substrate of a first conductivity type is provided at a surface with a surface layer of the opposite, second conductivity type whose thickness and doping concentration are chosen such that the surface layer can be depleted at least locally throughout its thickness without breakdown, whereby the layer is subdivided into a number of mutually separated islands by means of insulation zones of the first conductivity type which are diffused into the surface layer, and whereby a circuit element with a surface zone of the first conductivity type which extends from the surface into the surface layer over part of the thickness of the surface layer is provided in at least one of said islands. The invention also relates to a semiconductor device manufactured by this method. Such a method and a device manufactured thereby are known inter alia from the article "A versatile 700–1200-V IC process for analog and switching applications" by A. W. Ludikhuize, published in IEEE Transactions on Electron Devices, Vol. 38. No. 7, July 1991, pp. 1582–1589.

The resurf principle is described inter alia in the article "High voltage thin layer devices (resurf devices)" by J. A. Appels and H. M. J. Vaes, (Techn. Digests IEDM 1979, pp. 238/241) and is based on the phenomenon that electrical breakdown in a comparatively thin layer is avoided by means of depletion of the layer throughout its thickness, so that an electric field distribution is obtained at the surface such that the breakdown voltage approaches its theoretical maximum value. It follows from calculations that the product $N*d$ of the thickness d and doping concentration N must be of the order of $10^{12}$ atoms per $cm^2$ for resurf. Owing to the high breakdown voltage, the resurf principle is highly suitable for use in high-voltage semiconductor devices such as indicated in the above publication by Ludikhuize. This describes integrated circuits in which the surface layer is provided in the form of an n-type epitaxial layer of silicon on a p-type silicon substrate. Various circuit elements for high-voltage applications are provided in the epitaxial layer, such as transistors of the LDMOST (lateral DMOST) type. Such a transistor has a p-type channel region or back-gate region in which an n-type source is formed. The drain lies at some distance from the back-gate region, separated therefrom by an interposed drift region. As is noted in the cited publication, some transistors are used under operating conditions different from those for other transistors. Thus the same voltage (ground) is applied to the back-gate region and to the substrate in a number of transistors, which may give rise to a high voltage between back gate and drain. In other transistors, for example transistors operated in the source-follower mode or transistors at the high-voltage side in bridge circuits, a very high voltage may also be applied to the back-gate region. A high voltage may be present between the substrate and the back-gate region in this situation, which renders it imperative that no electrical breakdown (punch-through) occur between the substrate and the back-gate region. A similar situation can arise in the source and drain of HV p-channel MOS transistors. To avoid punch-through, the product $N*D$, in which D is the thickness of the portion of the epitaxial layer between substrate and back-gate region, must be sufficiently great. This is achieved in the known device in that the epitaxial layer is made comparatively thick while N has a low value, so that sufficient charge remains below the comparatively thin back-gate region; in the embodiment described, however, the epitaxial layer has a thickness of no more than 23 $\mu m$ for $N \approx 7*10^{14}$ per $cm^3$. It is found in practice, however, that it is comparatively difficult to manufacture such a device with a sufficient reproducibility owing to fluctuations in the doping, i.e. to keep. fluctuations of the total doping $N*d$ within 20%.

SUMMARY OF THE INVENTION

It is an object of the invention inter ali to provide a method of manufacturing a semiconductor device of the resurf type which has a higher reproducibility and a higher accuracy than known methods. According to the invention, the surface layer of the second conductivity type is formed partly through diffusion of impurities which are introduced into the semiconductor body from the surface and partly through diffusion of impurities from a buried layer which is provided over the entire surface of the surface layer with a doping concentration which is lower than the doping concentration of the insulation ones of the first conductivity type and which is redoped by the buried zones of the first conductivity type at the areas of the insulation regions. The impurities may be diffused into the surface layer by means of previously implanted regions, so that the total doping of the layer can be well controlled. Doping of the layer partly from a buried layer achieves that a sufficient impurity of the second type is present also under the surface zone of the first type, for example the back-gate region of a LDMOST, for preventing punch-through between the surface zone and the substrate. Moreover, the process does not or substantially not become more complicated than the known process because the implanted regions can be provided without masks and it is usually sufficient to provide thinner epitaxial layers.

An embodiment of a method according to the invention, in which the influence of the epitaxy process on the total doping in the layer is small, is characterized in that the surface layer is formed in a comparatively weakly doped epitaxial layer of the first or second conductivity type which is deposited on the substrate after the substrate has been provided at its surface with the buried zones of the first and the buried layer of the second conductivity type.

DETAILED DESCRIPTION OF THE PREFERRED EMBODIMENT

Figure 1:
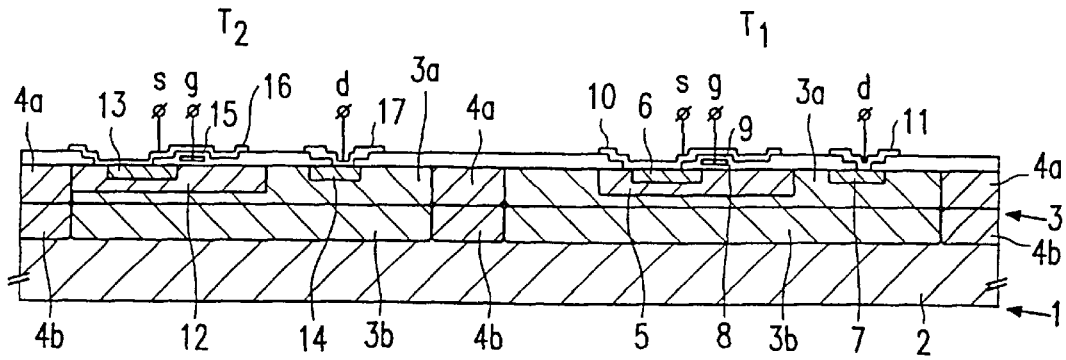
FIG. 1 is a cross-section of a high-voltage semiconductor device manufactured by a method according to the invention.

FIG. 1 shows in cross-section an integrated high-voltage circuit of the resurf type provided in a silicon body 1 with a p-type substrate 2 which is provided with an n-type surface layer 3. In accordance with the resurf condition, the composition of the layer 3 is such that it can be depleted at least locally throughout its thickness before breakdown occurs. A favorable field distribution is obtained through this depletion, as is known, in particular at the surface, so that the punch-through voltage approaches the intrinsic breakdown voltage of silicon and is influenced to a lesser degree by local field concentrations. To obtain the resurf effect, the thickness d and the doping concentration N of the surface layer 3 are so chosen that the product $N*d$ is approximately equal to $2*10^{12}$ atoms per $cm^2$. The surface layer 3 is subdivided into a number of mutually electrically insulated islands by means of p-type zones 4 which extend from the surface down to the substrate. The insulation zones 4 each have a region 4a which is formed from the surface of layer 3 and a region 4b which is formed from the substrate, the regions 4a and 4b forming a coherent region owing to diffusion into the surface layer. A high-voltage circuit element is provided in each of the islands depicted, in this example in the form of a lateral doubly diffused MOS transistor, called LDMOST for short hereinafter. The transistors are of a conventional construction and will accordingly be only briefly described. Transistor $T_1$ in the island on the right comprises a back-gate region 5 formed by a p-type surface zone 5. The source zone is formed by an n-type zone 6 provided in the p-type zone 5. The drain zone of the transistor is formed by the n-type surface zone 7 provided at a distance from the back-gate region 5 in the n-type surface layer 3, while the interposed portion of the surface layer 3 forms the drift region of the transistor. The portion of the back-gate region 5 situated between the source 6 and the drift region forms the channel region which is electrically insulated from the overlying gate 9 by the gate oxide 8. The source is contacted by a source electrode 10 which in this example is also connected to the back-gate region 5 and to a diagrammatically indicated connection s. As the drawing shows, the electrode 10 extends to above the drift region and forms a field plate there which effects a favorable field distribution in the drift region adjacent the back-gate region, thus increasing the breakdown voltage. The gate is connected to a gate connection g. The drain 7 is connected in a usual manner to the drain electrode 11 and, via this electrode, to the drain connection d.

Transistor $T_2$ provided in the island on the left has a construction which is substantially identical, with a p-type back-gate region 12, an n-type source 13, an insulated gate 15, and an n-type drain 14, separated from the back-gate region 12 by an interposed portion of the surface layer 3 which forms the drift region. The source and the back-gate region are provided with a contact 16 which is connected to a connection s. The drain 14 is provided with a contact 17 and a drain connection d.

The transistors may be connected, for example, in series so as to form a half-bridge circuit, where the source 13 of $T_2$ is grounded and the drain 7 of $T_1$ is connected to the high supply voltage, while drain 14 of $T_2$ is connected to source 6 of $T_1$. The transistors may then be switched on and off alternately by means of suitable control signals at the gate electrodes, so that a current in a first direction alternating with a current in the other direction can be passed through a load element connected to the junction between source 6 and drain 14. In such a situation, a very high voltage may be applied to the drain 14 of $T_2$, and thus a high reverse voltage across the pn junctions between the n-type island and the p-type insulation regions 4 and the p-type back-gate region 12. This voltage can be accommodated thanks to the resurf principle, possibly in combination with breakdown voltage raising, weakly doped p-type extensions (not shown) along the edges of the p-type zones. There is no voltage between the substrate 2 and the back-gate region 12, so that accordingly no breakdown will occur between the substrate and the back-gate region 12. As FIG. 1 shows, the back-gate region 12 may adjoin the p-type insulation zone 4 and may be connected to the substrate via this zone. In transistor $T_1$, breakdown between the n-type island and the p-type insulation zone 4 can also be avoided through the resurf principle in a manner analogous to that in $T_2$. In addition, there may be a high voltage between the back-gate region 5 and the substrate 2 in $T_1$. To prevent punch-through occurring between the regions 2 and 5, the semiconductor layer 3 must have so much doping below the back-gate region 5 that the punch-through voltage is higher than the supply voltage. This is achieved in a simple and reproducible manner in that the semiconductor layer 3 according to the invention is doped from two sides, indicated diagrammatically in FIG. 1 with the reference numerals 3a for the portion doped from the upper side and 3b for the portion doped from the substrate side.

Figure 2:
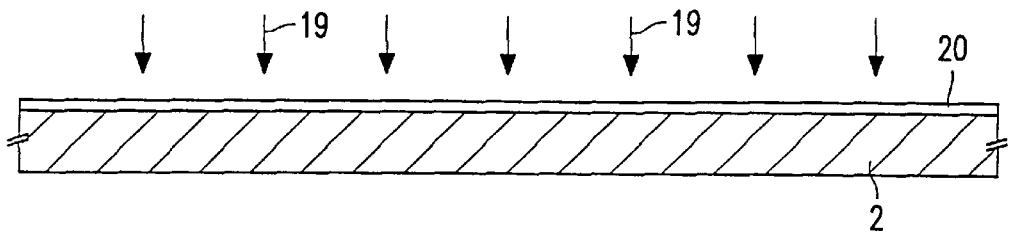
FIGS. 2 to 7 show this device in a number of stages of its manufacture.
Figure 3:
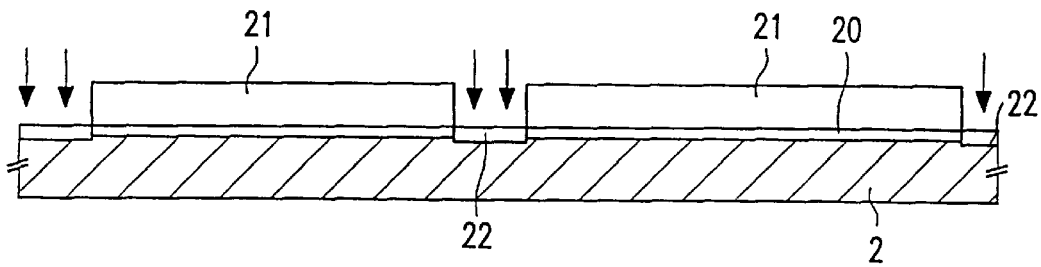
Figure 4:
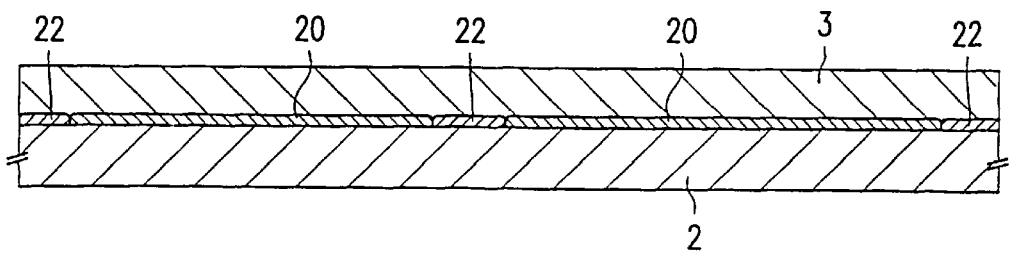

The process of manufacturing the device of FIG. 1 will now be described with reference to FIGS. 2 to 7. It starts, as shown in FIG. 2, with a high-ohmic p-type silicon substrate 2 with a resistivity of, for example, 30 $\Omega$.cm for 300 V applications. The resistivity is chosen to be higher for higher-voltage applications, for example 100 $\Omega$.cm for 700 V. The upper surface of the substrate is doped with an n-type impurity 20 through implantations of P ions, indicated diagrammatically with arrows 19. The doping is carried out over the entire surface, i.e. also where in a later stage the p-type insulation regions 4 will be formed, so that a mask can be dispensed with. The doping level is approximately $0.7*10^{12}$ atoms per cm². In a next step (FIG. 3), an implantation mask 21 is provided on the substrate with openings at the areas of the zones 4b to be formed, after which the p-type doped zones 22 are formed through implantation with boron ions, diagrammatically indicated with arrows 22. The doping level is, for example, approximately $3*10^{12}$ atoms per cm², or more, so that the previously provided n-type zone 20 is redoped. Obviously, the order of the two doping steps may alternatively be reversed, the p-type zones 22 being first provided through masked implantation and the n-type zones 20 subsequently in a blanket implantation. The mask 21 is then removed in a usual manner, whereupon possibly a heating step is carried out in order to restore lattice damage caused by the ion implantation and, if necessary, to form an alignment marker for subsequent process steps. Then the surface layer 3 is deposited in the form of an epitaxial layer in a usual manner on the surface of the substrate. The thickness of the layer 3 is, for example, approximately 7 $\mu$m. The doping of the layer 3 in this example is weakly n-type, but it may alternatively be weakly p-type, if so desired. During the deposition, the impurities provided in the buried zones 20 and 22 may already diffuse a little into the epitaxial layer 3, as indicated in FIG. 4. The surface of the epitaxial layer may be covered with a thin oxide layer, if so desired, which offers advantages in the subsequent doping steps. This oxide layer is not shown in the drawing.

Figure 5:
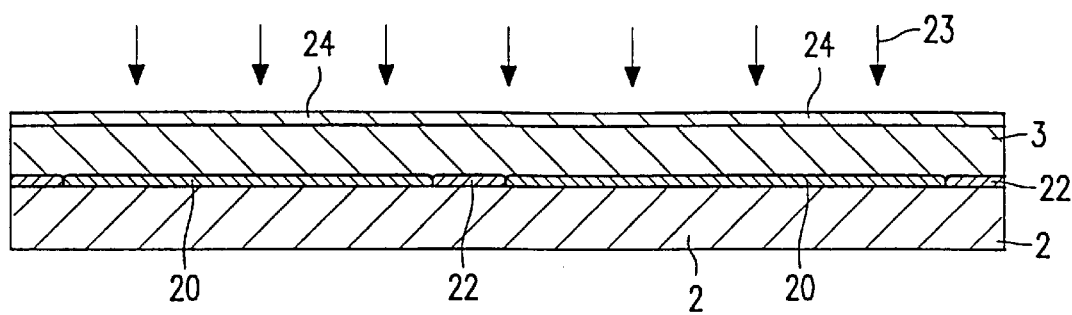
Figure 6:
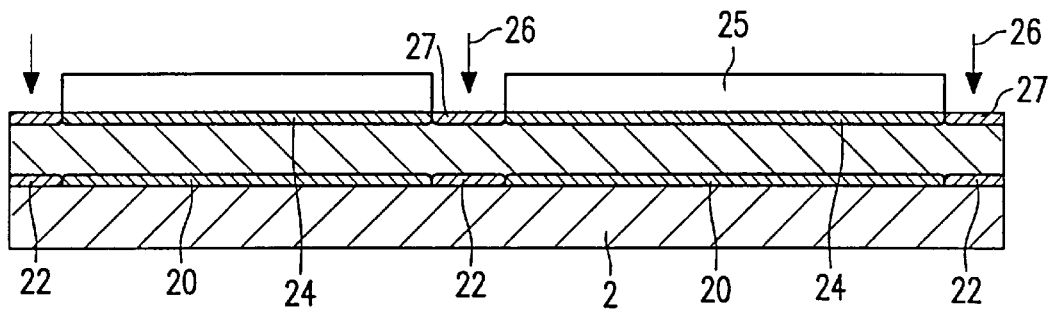
Figure 7:
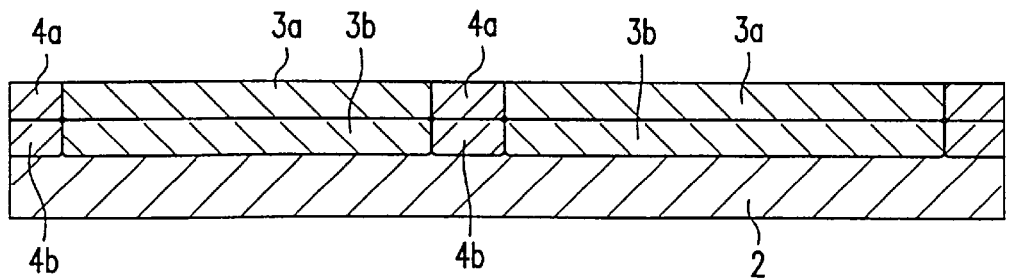

In a next step shown in FIG. 5, the surface of the epitaxial layer is provided with an n-type layer 24 through implantation 23 of phosphorus ions. The doping level of this implantation step is, for example, approximately $1.5*10^{12}$ atoms per cm². The implantation is carried out over the entire surface without a mask in this embodiment. It is possible in other embodiments for this implantation to be carried out locally only with the use of a mask. In a next step shown in FIG. 6, the surface is provided with a mask 25 with openings at the areas of the p-type zones 4a to be provided. The p-type regions 27 are provided in the epitaxial layer through implantation of boron ions with a higher doping concentration than the preceding n-type implantation 23, i.e. the zone 24 is locally redoped. The mask 25 is then removed, whereupon the n-type impurities in the zones 20 and 24 are diffused in opposite directions into the epitaxial layer 3 at high temperature, where they will form the sub-layers 3a and 3b. Simultaneously, the p-type impurities in the zones 22 and 27 diffuse towards one another and form the insulation regions 4a, 4b (FIG. 7) in the epitaxial layer. The transistors may be manufactured in usual manner in a next series of steps, whereby the configuration shown in FIG. 1 is obtained.

The use of the method described above renders it possible to adjust the doping of the surface layer 3 with accuracy. The total doping is substantially equal to the sum of the dopings of the implantations 19 and 23 and is accordingly approximately $2*10^{12}$ atoms per cm$^2$, in accordance with the resurf condition. The fact that the layer 3 is doped at least part from a buried layer moreover achieves that the doping below p-type zones of high voltage, such as zone 5, is so high that breakdown between these zones and the substrate is prevented. The process remains comparatively simple because this buried layer is provided without a mask.

It will be obvious that the invention is not limited to the embodiment described here, but that many more variations are possible to those skilled in the art within the scope of the invention. Thus a p-type epitaxial layer may be deposited on the substrate instead of an n-type epitaxial layer. The invention is not limited to the sequence of the various steps according to the embodiment. Thus, for example, implantation 23 may alternatively take place after implantation 26, and possibly even after the back-gate regions 5 and 12 have been provided. It is also possible for the boron implantation 22 to extend partly below active transistor regions, for example the back-gate region 12 of transistor $t_2$. Instead of or in addition to the LDMOST structures described, other (high-voltage) circuit elements such as bipolar transistors or p-channel MOS transistors may be provided in the surface layer 3.

I claim:

1. A method of manufacturing a high voltage semiconductor device of the resurf type, said method comprising providing a silicon substrate of a first conductivity type, doping said substrate with a dopant of a second conductivity type to form a buried layer on said substrate, redoping the buried layer with a second dopant of said first conductivity type by diffusing said second dopant into said buried layer in insulation zones which subdivide said buried layer into mutually separated islands, providing a surface layer over said buried layer, said surface layer having a surface facing away from said buried layer, doping said surface of said surface layer with dopant of said second conductivity type, diffusing said dopant of said second conductivity type into said surface layer from said buried layer and from said surface of said surface layer to form islands having a doping concentration of said second conductivity type, said islands being mutually separated by insulation zones having a doping concentration of said first conductivity type, the concentration of dopant of said second conductivity type in said islands being lower than the concentration of dopant of said first conductivity type in the insulation zones, and providing a circuit element in at least one of said islands, said circuit element comprising a surface zone of the first conductivity type which extends into the surface of the surface layer.

2. A method as in claim 1 wherein said doping, redoping, and diffusing are carried out so that the surface layer has a total doping substantially equal to $2 \times 10^{12}$ atoms/cm$^2$.

3. A method as in claim 1 wherein said surface layer is formed by an epitaxial layer which is doped with dopant of one of said conductivity types, prior to diffusing said dopants into said surface layer.

4. A method as in claim 1 wherein said buried layer has a doping concentration chosen so that breakdown of the surface layer is prevented when a voltage is applied between the surface zone and the substrate.

5. Method as in claim 1 wherein said redoping is accomplished by providing a mask having openings over said buried layer, and bombarding said mask with ions of said first conductivity type to form insulation zones corresponding to said openings.

6. Method as in claim 1 further comprising doping the surface of said surface layer with dopant of said second conductivity type, thereby providing a source of dopant for diffusing dopant into said surface layer.

7. Method as in claim 6 further comprising redoping the surface of said surface layer with dopant of said first conductivity type in insulation zones which overlie said insulation zones in said buried layer.

\* \* \* \* \*